United States Patent
Arai et al.

[11] Patent Number: 6,092,538
[45] Date of Patent: Jul. 25, 2000

[54] METHOD FOR USING HIGH DENSITY COMPRESSED LIQUEFIED GASES IN CLEANING APPLICATIONS

[75] Inventors: Kunio Arai, 4-6, Tomizawa 3-chome, Taihaku-ku, Sendai-shi, Miyagi 982; Hiroshi Inomata; Richard Lee Smith, both of Sendai, all of Japan

[73] Assignees: Shuzurifuresher Kaihatsukyodokumiai, Hanamaki; Kunio Arai, Sendai, both of Japan

[21] Appl. No.: 09/043,413

[22] PCT Filed: Sep. 25, 1997

[86] PCT No.: PCT/JP97/03409

§ 371 Date: Jul. 14, 1998

§ 102(e) Date: Jul. 14, 1998

[87] PCT Pub. No.: WO98/13149

PCT Pub. Date: Apr. 2, 1998

[30] Foreign Application Priority Data

Sep. 25, 1996 [JP] Japan .................................. 8-252962
Dec. 3, 1996 [JP] Japan .................................. 8-322719

[51] Int. Cl.[7] ...................................................... B08B 3/10
[52] U.S. Cl. .......................... 134/1.3; 134/25.4; 134/105; 134/902; 134/111; 134/184
[58] Field of Search .................................. 68/18 R, 18 C; 134/902, 105, 110, 111, 186, 184, 1.3, 25.4

[56] References Cited

U.S. PATENT DOCUMENTS

| | | |
|---|---|---|
| 5,013,366 | 5/1991 | Jackson et al. . |
| 5,213,619 | 5/1993 | Jackson et al. . |
| 5,306,350 | 4/1994 | Hoy et al. . |
| 5,339,844 | 8/1994 | Stanford et al. . |
| 5,344,493 | 9/1994 | Jackson et al. . |
| 5,355,901 | 10/1994 | Mielnik et al. . |
| 5,412,958 | 5/1995 | Iliff et al. . |
| 5,676,705 | 10/1997 | Jureller et al. . |
| 5,759,209 | 6/1998 | Adler et al. . |

FOREIGN PATENT DOCUMENTS 6-120190  4/1994  Japan .

*Primary Examiner*—Frankie L. Stinson
*Attorney, Agent, or Firm*—Oliff & Berridge, PLC

[57] ABSTRACT

A method uses a high density compressed liquefied gas in cleaning applications in a closed recycle system to achieve effective and economical cleaning without using any high pressure generating device. The closed recycle system can include a pressure cleaning vessel provided with a plurality of nozzles for pre-cleaning, atmospheric containers for expanding compressed liquid, sound wave generators and an agitator. The system can also include a pressure recovery vessel provided at a lower portion than the pressure cleaning vessel and having a detachable drain cylinder suspended from under the pressure recovery vessel and also having a temperature regulator for receiving contaminated liquid that has been pre-cleaned from a pressure cleaning room. The pressure recovery vessel can be connected with a high density compressed liquefied gas supply cylinder through communication with vapor therein to eliminate enriched liquid with contaminants through the drain cylinder as well as removing and transferring solvent by the vapor occurred from the temperature regulator.

11 Claims, 7 Drawing Sheets

State diagram for a pure component showing supercritical fluid & near-critical fluid regions.

METHOD FOR USING HIGH DENSITY COMPRESSED LIQUEFIED GASES IN CLEANING APPLICATIONS

TECHNICAL FIELD

This invention entitled "Method for using high density compressed liquefied gases in cleaning applications" relates to a cleaning means, which can achieve high efficiency at low cost by using a series of cleaning steps as cleaning factors, such as physical energy, chemical force and salvation and provides a new system for the recycle and recirculation of cleaning solvents without any expensive high pressure generating equipments, such as compressors, high pressure pumps or others.

BACKGROUND ART

Semiconductors and the like hereafter referred to as objects to be cleaned are placed inside a pressurized cleaning vessel in which supercritical fluid is fed for cleaning of the said objects to be cleaned by contacting with supercritical fluid and dissolution of impurities adhered to the objects. The supercritical fluid is circulated. When eliminating the supercritical fluid in which these contaminatns dissolved from the pressurized cleaning vessel by a suitable means, the objects which were precisely cleaned are obtained. A troublesome process for drying the objects required in so-called wet cleaning methods is unnecessary since the supercritical fluid is completely vaporized by a decompressing operation.

It is possible to reuse the supercritical fluid because such supercritical fluids with the above-mentioned contaminants are transferred from the cleaning vessel into a separation tank (or a recovery tank) and then the solvent is separated from the contaminants by mechanism stated whithin.

As shown in the FIG. 7 concerning a schematic plot of the states of the pure substance and Its supercritical state, this is the latest technique for cleaning semiconductor substrates by using the following two characteristics of the supercritical fluid in its high density fluid state in which condition of pressure and temperature at the near critical region is P>P. (cririca1 pressure) and T>T. (critical temperature).

Characteristic 1: It is possible to easily obtain a great change in density with a slight change of pressure. It is also possible to obtain a great difference or solubility because the solubility of substance is in general, proportional to the density thereof.

Characteristic 2: The density of a supercritical fluid has low viscosity and high diffusivity although it is similar to liquid. Therefore, such a characteristic is advantageous when a 'substance moves.

The priciple shows that firstly, the low viscosity of the supercritical fluid can easily enter into narrow pores and crevices. On the contrary, for the case of high viscosity thereof, the fluid has high solubility for contaminants adhered or penetrated into a substrate, especially organics substances. Secondly, the above-mentioned cleaning operation is achieved with the supercritical fluid containing the contaminating substance, and the contaminants can be divided between solid and liquid states because solubility of the said contaminants is weakened by decreasing the density thereof. Accordingly, in this invention, it is possible to recover these components by a decompression operation in a separation vessel.

After the contaminants are separated from the solution, the purified supercritical fluid used in the pressurized cleaning vessel can be stored and recycled resulting in a closed recycle system.

Applicable gases in this invention are carbon dioxide, nitrous oxide, ethane, propane and the like. In particular, carbon dioxide is highly suitable to handle since it is nonflammable, nontoxic and inexpensive, and has a critical temperature of 31.1° C. and a critical pressure of 72.8 atmospheres.

In such a recycle system mentioned above, a general fluid tranfer method can be accomplished with a high pressure generator such as compressors, pumps, etc. to make and keep the supercritical state. However, such equipment as cleaning equipments are very costly since these equipments need the high ability to generate high pressure, and further these methods are known to generate fine particles that are detrimental to the cleaning process.

Even though it is possible to depend only upon the use of solvents for cleaning, for a case when this is not effective, it is available to use forced means, for example agitation and/or ultrasonic energy for promoting cavitation in order to impart cleaning action. The various contaminants to be difficult to dissolve can be effectively dissolved with addition of an entrainer.

The above-mentioned characteristics of the supercritical fluid are to include near-critical fluids. As shown in the pressure-temperature diagram of FIG. 7, a near-critical fluid denotes that a fluid exists in the neighbouring region of the critical point and the fluid exists as a compressed liquid and a compressed gas. Fluids in this region and supercritical fluids behave distinctly. What exists in the near critical region or the supercritical region of the neighbouring region point above the critical temperature is given the name of a high density liquefied gas.

As an example, there is a simple cleaning method to reduce cost disclosed in the Japanese Patent Publication No. 7-171527 (1995), which teaches a means as to a high density liquefied gas used as solvent in the critical region and supercritical fluid but requires high pressure major equipment components.

The features in said Japanese Patent Publication are a means of temperature control provided in a cleaning vessel and the use of ultrasonic energy for cavitation. Namely, what was described in said Publication is only one means to improve cleaning efficiency with temperature control using a high density liquefied gas in a cleaning vessel with cavitation produced from ultrasonic energy.

However, this method teaching in said Publication is still insufficient for reducing cost since a pump and the like are employed as the power to transfer a high density liquefied gas in a process for removing contaminants and recoveriing solvent in a closed recycle system. Moreover, particles and other contaminants. either as metals, inorganics, degraded seals or gaskets or as lubricants, oils or other undesirable fluids, are introduced into the cleaning system through use of these high pressure major equipment components. Furthermore, in this method mentioned above, it is not sufficient to completely remove contaminants by cavitation with strong agitation for supplementing reduction of the cleaning advantage of high permeability in a supercritical state because only the partially projected contaminants are removed. Although cleaning in this method is carried out by immersing the objects to be cleaned in liquid which is indispensable for cavitation, contaminants in the liquid re-adhere onto the objects due to many solid contaminants being In the liquid. Thus, such a method in prior art has an inconvenient factor because there is a re-cleaning step as another process for achieving complete cleaning. Further, for the case of using a high density liquefied gas including $CO_2$ as solvent having the critical temperature in the vicinity of room temperature, it is hardly expected that contaminants adhered on inorganic compounds, polar substances and others having remarkable characteristics of being difficult to dissolve are perfectly removed even though entrainers were added for increasing the cleaning effect. Therefore, at the present time, there is great anticipation among these in the trade of how such a difficult problem can be solved simply and improved for industrial applications.

In view of the above-mentioned contemporary circumstances that are noted to be difficult to improve, one objective in this invention is to provide a new method using a high density liquefied gas for achieving the cost reduction, remarkably powerful cleaning, an effective cleaning means for solving a difficult problem as to re-adhering and especially. a complete cleaning of contaminants consisting of inorganic compounds, polar substances, etc., even if the solvent has the critical temperature in the vicinity of room temperature.

DISCLOSURE OF THE INVENTION

A method for cleaning in this invention is achieved by the following means.

Cleaning equipment using a high density compressed liquefied gas wherein a closed recycle system comprises:
- a pressure cleaning vessel provided with a cleaning basket supported in space within said pressure cleaning vessel for accomodating the objects to be cleaned and a plurality of nozzles to emit a spray of compressed liquid directly to said objects to be cleaned, and atmospheric container placed over and connected to said pressure cleaning vessel, said cleaning vessel further provided with an agitator consisting of an impeller disposed in the bottom of said cleaning vessel and sound wave generator directed towards said impeller and disposed in said wall of said cleaning vessel;
- a pressure recovery vessel equipped with means for controlling temperature and placed under and branched from said pressure cleaning vessel for receiving the used cleaning liquid after the cleaning process and having a drain cylinder detachably suspended from under said pressure recovery vessel;
- a high density compressed liquefied gas supply cylinder equipped with means for controlling temperature and placed over said pressure cleaning vessel so as to provide communication with the upper portion of said pressure recovery vessel and storage for receiving the upper vapor therefrom;
- an entrainer vessel disposed and connected halfway the feed line between said high density compressed liquefied gas supply cylinder and said pressure cleaning vessel; and
- said vessels for supplying and receiving the respective compressed liquid are communicating between the respective upper portions thereof for providing communication between the upper vapor in the respective vessels.

According to the above-mentioned means, the advantages of a high density liquefied gas which exists In the both regions of the near-critical region and the supercritical region in the neibouring region of the critical point can be practically used. As already mentioned, in this invention, it is greatly expected to decrease costs of operation and maintenance, and is not necessary to use any expensive equipments, such as a high pressure generator since solvent transfer is completely carried out by gravity set in level differences based upon vapor pressure and under vaporized state due to low energy for transferring heat, vaporization and liquefaction.

As a further advantage, the elimination of the pressurizing components in the system removes a large source of contaminants and impurities introduced into the system by use of such components.

Furthermore, the pressure cleaning vessel having the pressure recovery vessel placed under from said pressure cleaning vessel for communicating each other immediately removes massive contaminants already cleaned by emission of a plurality of nozzles for pre-cleaning outside said pressure cleaning vessel for preventing re-adhesion of the contaminants, and as the next step for complete cleaning, contaminants are cleaned by further clensing under a condition filled with solvent, which can be advantageously isolated and evacuated so that further cleanings do not contain contaminants from previous cleanings. For these results, the chance to re-adhere massive contaminants to the objects to be cleaned is absolutely prevented with the described. invention. Thus, it is expected to perfectly clean the objects to be cleaned because It is possible to repeat such a cleaning method to achieve the desired level of cleanliness.

An advantage in this invention is that with the characteristic phenomenon of the critical region, it is possible to create bubbling throughout all regions in said pressurized cleaning vessel when the solvent is expanded slightly by exposure to atmospheric conditions, namely, in microprocessing manufacture, and cavitation can be further promoted by agitation made by generating ultrasonic energy throughout the solvent.

Wherein, it is possible to Install an ultrasonic generator for projection within this cleaning system and also possible to transfer this energy together with an agitator into every vessel, which gives a large effect in comparison with the case of partial projection.

For the case of difficult to clean contaminants that cannot be removed with single component high density liquefied gases, it is possible to achieve cleaning of inorganic substances and polar compounds by adding an appropriate surfactant for each of the contaminants, which is the so-called micelle phenomenon recently discovered for solvating contaminants. Further, the contaminants solvated as a micelle that form an effective barrier can be prevented from re-adhering, which represents an advance in cleaning.

The cleaning method in this invention is achieved with the above-mentioned cleaning mechanism and cleaning equipment consisting of a pressure cleaning vessel provided with a cleaning basket supported in space within said pressure cleaning vessel for accomodating the objects to be cleaned and a plurality of nozzles to emit a spray of compressed liquid directly to said objects to be cleaned, and atmospheric containers placed over and connected to said pressure cleaning vessel, said cleaning vessel further provided with an agitator consisting of an impeller and disposed in the side walls of said cleaning vessel, and a pressure recovery vessel equipped with means for controlling temperature and placed under and branched from said pressure cleaning vessel for receiving the used cleaning liquid after the cleaning process and having a drain cylinder detachable and suspended from under said pressure recovery vessel.

In the cleaning process mentioned above, said atmospheric containers provided with a means for controlling temperature cool down the feed gas, liquefy and restore into said pressure cleaning vessel through a recycle supply system, and with such a solvent cycle, it is practical to permanently perform the above-mentioned cavitation for a long time.

BRIEF DESCRIPTION OF THE DRAWINGS

Finally.

BEST MODE FOR EMBODYING THE INVENTION

Detailed explanation of this invention is given in accordance with the accompanying figures.

Figure 1:
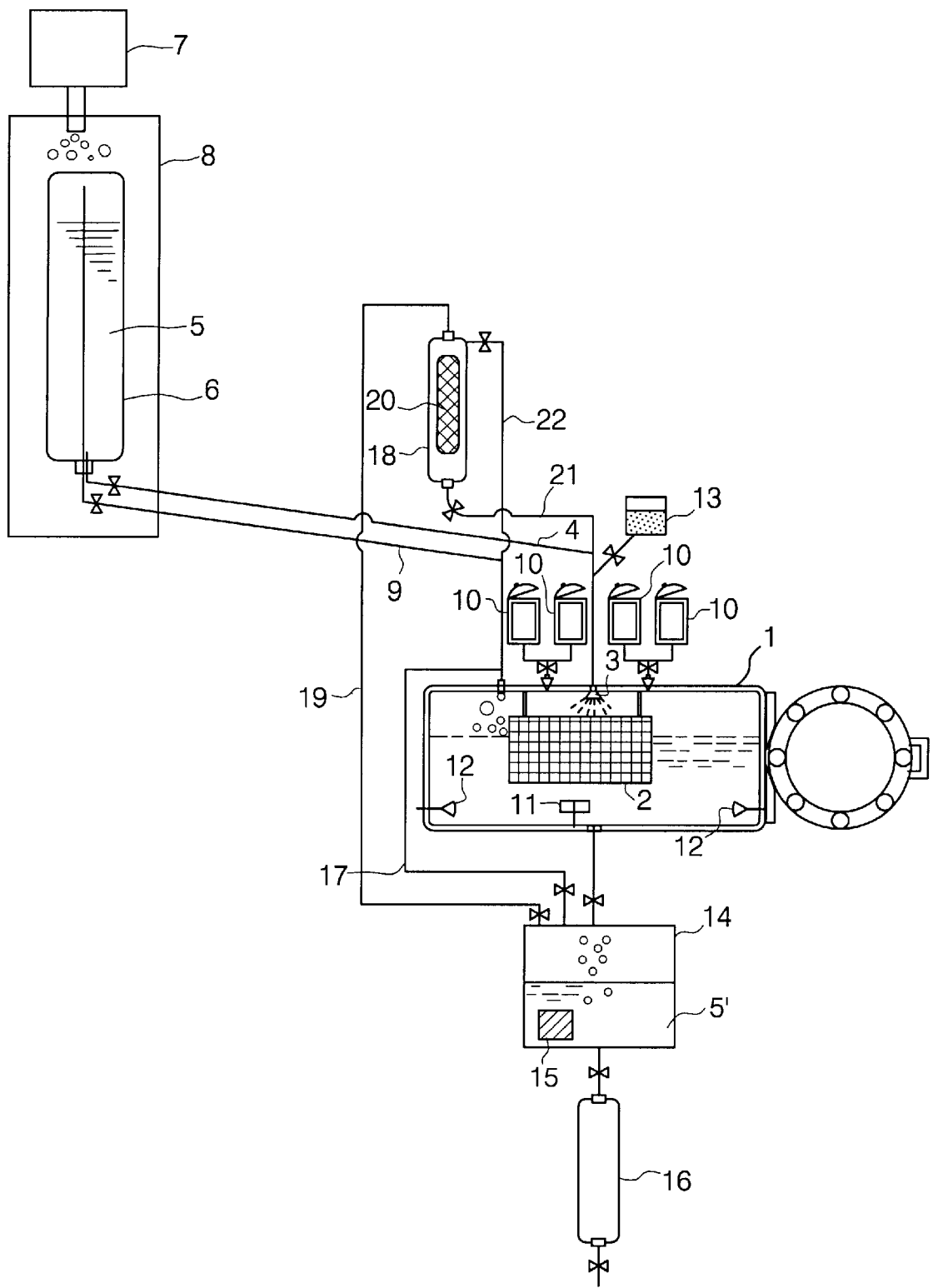
FIG. 1 shows a schematic of the basic equipment configuration of this invention.

As shown in FIG. 1, a pressure cleaning vessel (1) supports a cleaning basket (2) in space directly under a plurality of nozzles (3) (for effective cleaning) within said pressure cleaning vessel for accomodating the objects to be cleaned. In this case, it Is desirable for nozzles (3) to have turnable necks. A jet stream is emitted from said nozzles (3) to the objects to be cleaned in said basket (4) for a pre-cleaning. The emitted jet stream strikes appropriately to the objects to be cleaned and the impact energy strips off or forces off contaminants effectively. A solvent raw material supply cylinder (6) filled with a high density liquefied gas supplies compressed liquid (5) into said pressure cleaning vessel (1) from a high pressure tube (4) and said nozzles (3), and in an example in FIG. 1, a temperature controller (7) is accomodated into a box (8) provided at a higher position from said pressure cleaning vessel (1) due to the level difference with said vessel (1) for supplying and/or transferring said compressed liquid (5). (In this case, a transfer of said liquid (5) is reliably performed with vapor pressure difference set at higher temperature than said pressure cleaning vessel (1) when said temperature controller (7) is accomodated into said supply cylinder (6), and further such a transfer is supported through a high pressure tube (9) connecting at upper portions of the both vessels.)

Some atmospheric containers (10, . . . . . ) connected to the upper portion of said pressure cleaning vessel (1) are disposed to expand space within said cleaning vessel (1). Consequently, with said atmospheric. container (10*s*), it is possible to expand said compressed liquid (5) filling said pressure cleaning vessel (1) to create bubbling. Further, as shown in detail in FIG. 3-*c,* impellers (11) are disposed at a portion directly under said cleaning basket (2) and also the portion in the bottom of said cleaning vessel (1), a sound generator (12) directed towards said impellers (11) is disposed along with the wall in said pressure cleaning vessel (1), and then a powerful agitation is performed with the mutual operation for a forced agitation caused by these equipments and cavitation arisen with said impellers (11) rotating by ultrasonic energy. Through these operations, the main cleaning for the objects to be cleaned can be performed in said filled compressed liquid (5) together with such a strong agitation. The afore-mentioned bubbling and cavitation cause sudden decompression that is effective for killing and destroying bacteria and also bacillus.

An entrainer vessel (13) is connected at a halfway portion between said tube and a nozzle (3). In case that there are. impurities to be difficult to dissolve by only high density compressed liquefied gas, such impurities are sucked and added into the compressed liquid (5) in the tube (4) due to an orifice working, because the surfactants having characteristics to be useful for contaminants of lipophilic, hydrophilic and/or the both of them are dissolved in advance in said entrainer vessel (13). As said surfactants can dissolve the above-mentioned impurities with the so-called micelle phenomenon, this yields an effective barrier and makes it difficult for particles to re-adhere.

Figure 3A:
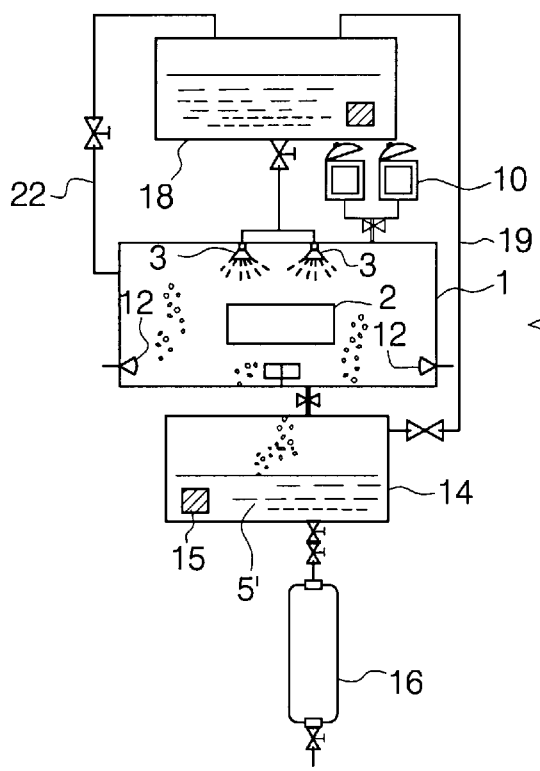
Figure 3B:
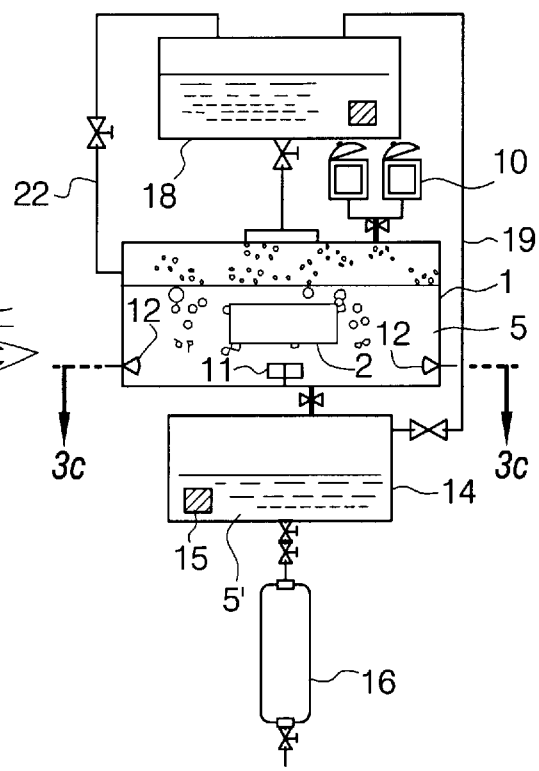
Figure 3C:
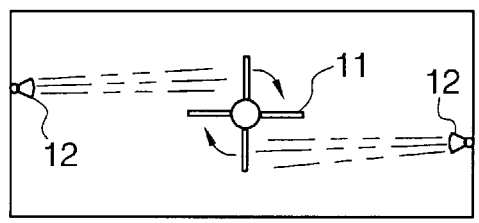

A pressure recovery vessel (14) is equipped for receiving cleaning liquid (5') at a lower portion from a pressure cleaning vessel (1). Wherein, said liquid (5') is smoothly received with a fall of the liquid level, a difference in vapor pressure and a vapor-mutual connection. Said pressure recovery vessel (14) with an internal temperature regulator (15) has a drain cylinder (16) detachably suspended from under said vessel (14). Therefore, as a remarkable recycle system in this invention, it is possible to severe the connection of said drain cylinder (16) filled with contaminants and also re-connect an empty drain cylinder (16). In this system, said pressure recovery vessel (14) has a role of the vapor space of said pressure cleaning vessel (1). Namely, for the above mentioned pre-cleaning, since contaminants including massive impurities are immediately flown through the tubes with excess cleaning liquid (5'), the liquid does not stay inside said pressure cleaning vessel (1) (See FIG. 3-*a*). Consequently, with the aforementioned main-cleaning and pre-cleaning, and disconnection of vapor-mutual connection, the compressed liquid (5) that is loaded with contaminants is eliminated from the system, which increases the cleaning efficiency (FIG. 3-*b*). Finally, in this invention, the problem of so-called re-adhesion is completely solved.

For repetitive cleaning, high cleaning efficiency is assured. Then, said pressure cleaning vessel (1) and said pressure recovery vessel (14) prevent re-adhesion and furnish an excellent mechanism for complete cleaning. Thus, for the case of cleaning numerous difficult to dissolve impurities with single component high density liquefied gases, surfactants that have affinity to the contaminants are used to create the so-called micelle phenomenon that improves cleaning power and prevents particles from re-adhering, and with nozzle impact energy, forces their removal along with bubbling, cavitation, super high-speed agitation and chemical complexes, an advance in cleaning efficiency is realized.

The vapor space of said pressure cleaning vessel (1) is connected with a vapor path tube (17). The vapor of said pressure recovery vessel (14) is connected through a tube (19) with the upper portion of a high density compressed liquefied gas supply cylinder (18) as a means for storage within a closed recycle system placed over the pressure cleaning vessel (1), and then with a temperature controlling regulator (15) in said pressure recovery vessel (14), the vaporized solvent is transported to said cylinder (18) by the vapor-pressurized difference. On the other hand, the vapor density is low and the salvation force is small so the large specific gravity of the contaminants as well as entrainers are deposited and concentrated in the liquid at the bottom. The concentrated part falls with gravity to a drain cylinder (16), where contaminants can be isolated from the system and separated. In brief, the essence of an achievement is that said pressure recovery vessel (14) and said high density compressed liquefied gas supply cylinder (18) provide separation and recovery, contaminant removal, solvent recovery and transport without any specialized high pressure generators. Final result is that low capital and operating cost can be easily realized with this invention.

With an internal temperature controlling regulator (20) for said cylinder (18), the above-mentioned vaporized solvent can be cooled and liquefied. A tube (21) connected at the lower portion of said cylinder (18) is connected another tube (4) to connect with a nozzle (3) of the pressure cleaning vessel (1). A communicating tube (22) for all vapor is provided in order to complete fluid transportation arisen by liquid level drop. In this case, such a drop is completed by a temperature difference occured by heating with said temperature controlling regulator (20). Thus, a new and original recycle system for a complete cleaning in which solvent circulation is completely achieved by an only means for controlling temperature and without any expensive high pressure generators can be supplied. The elimination of high pressure generators also reduces a source of contamination critical to semiconductor applications.

Figure 2:
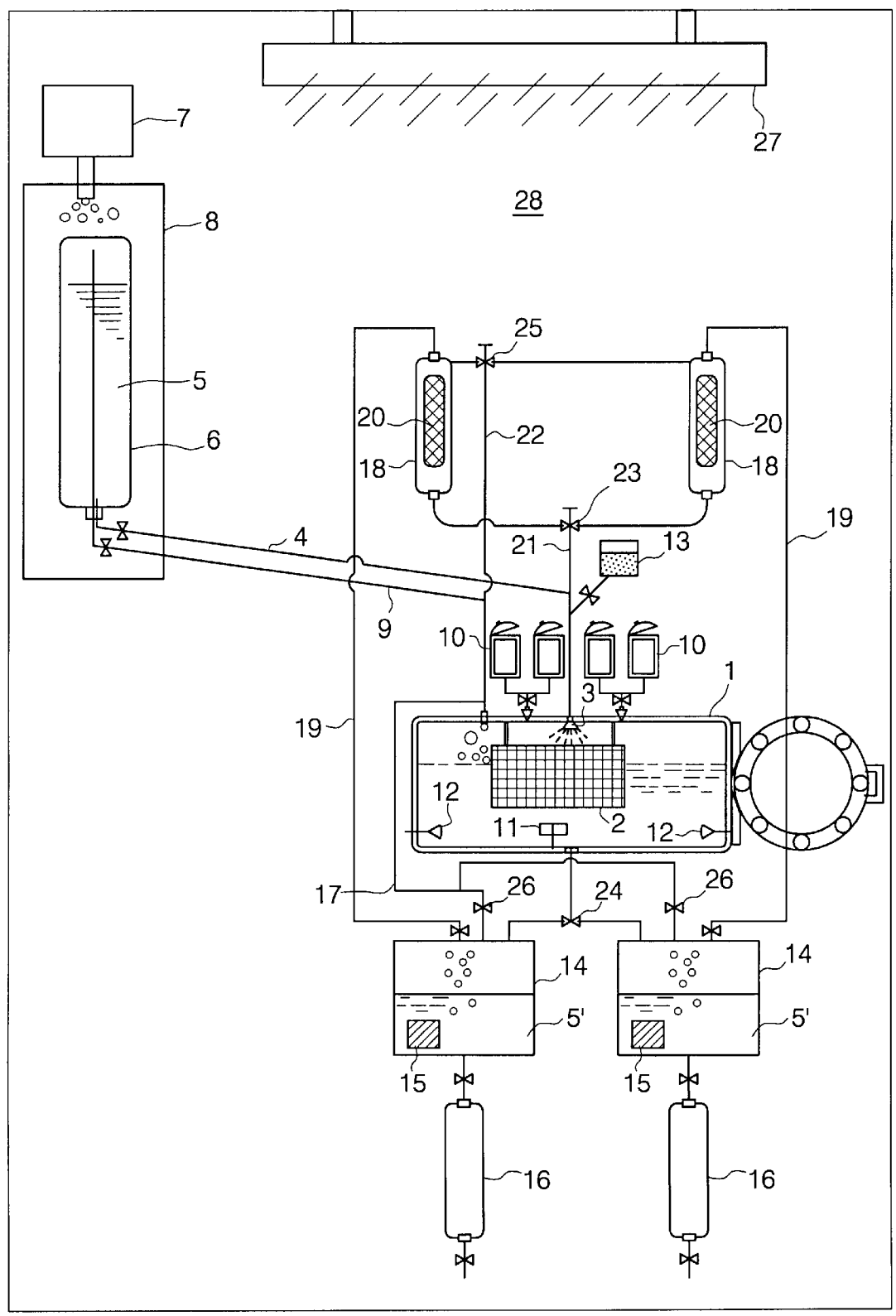
FIG. 2 shows a schematic for the multiple use of recycle system, FIG. 3-*a* shows a pre-cleaning as a typical cleaning mode in a pressure cleaning vessel, FIG. 3-*b* shows a main-cleaning as another typical cleaning mode wherein, and FIG. 3-*c* shows a schematic of an agitation equipment.

FIG. 2 shows an example in which the above-mentioned recycle system (—a pressure recovery vessel (14)—a high density compressed liquefied gas supply cylinder (18)—) is provided for a multiple use. which can exceedingly increase the function and potentiality of said pressure cleaning vessel (1). Both systems can send liquid by changing three-way valves (23) and (24), which allows vapor to be sent from a valve (25) through the junction at a valve (26). The undermentioned is an explanation with use of this method for an actual operation with $CO_2$ to be a solvent.

All of the equipment in this invention are arranged inside a room (28) with air conditioning control equipment (27) that guarantees a temperature of 20° C., which is comfortable for people who are working in manufacturing. A cylinder (6) is controlled at 30° C. with a temperature control regulator (7). For the case of the cleaning objects with surfactants and the like, the temperature of the compressed liquid (5) in said pressure cleaning vessel (1) is decreased to about 20° C. In said pressure recovery vessel (14), the temperature becomes 30° C. due to said temperature control regulator (15). For this, the upper part of the liquid is mostly vaporized. Single overall vaporization time tor 4-U.S. gallons requires about 40 minutes however, being that this is a dual system, the time can be reduced to 20 minutes. The high density compressed liquefied gas supply cylinder (18) is filled with compressed liquid (5) through cooling at 0° C. with said temperature control regulator (20).

On the other hand, when loading the objects to be cleaned into said pressure cleaning vessel (1), it takes about 10 minutes until cleaning can commence, however with the dual system, the waiting time for the next cleaning is negligible, which allows the realization of high operation efficiency.

Next, as a matter of course, the advanced cleaning features in FIGS. 4 to 6 will be explained as follows.

Objects to be cleaned are placed into a cleaning basket (102) and supported In said pressure cleaning vessel (101) directly under multiple (necessary for more effective cleaning) nozzles (103). In this case, it is desirable for the nozzles (103) to be adjustable. A jet stream is emitted from said nozzles (103) that strikes and pre-cleans the objects to be cleaned inside of said cleaning basket (102). The impact energy incurred by the emitted jet stream is effective to force off or remove contaminants.

Figure 6A:
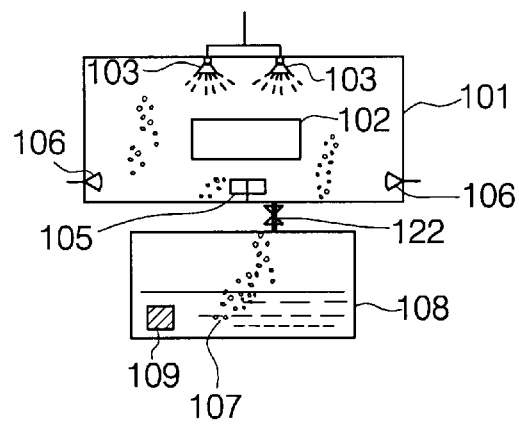
Figure 6B:
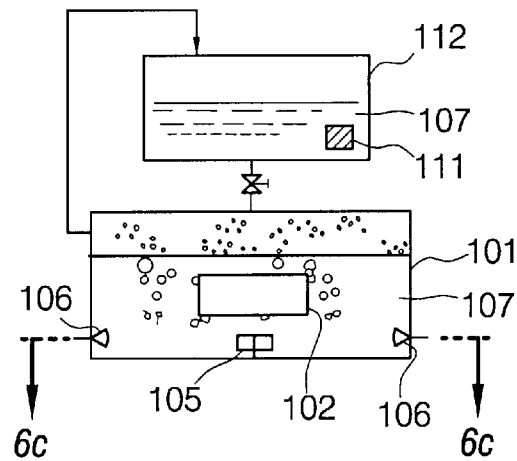
Figure 6C:
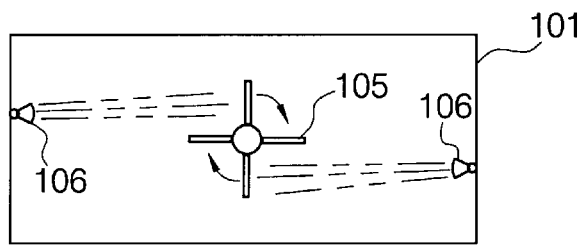
Figure 7:
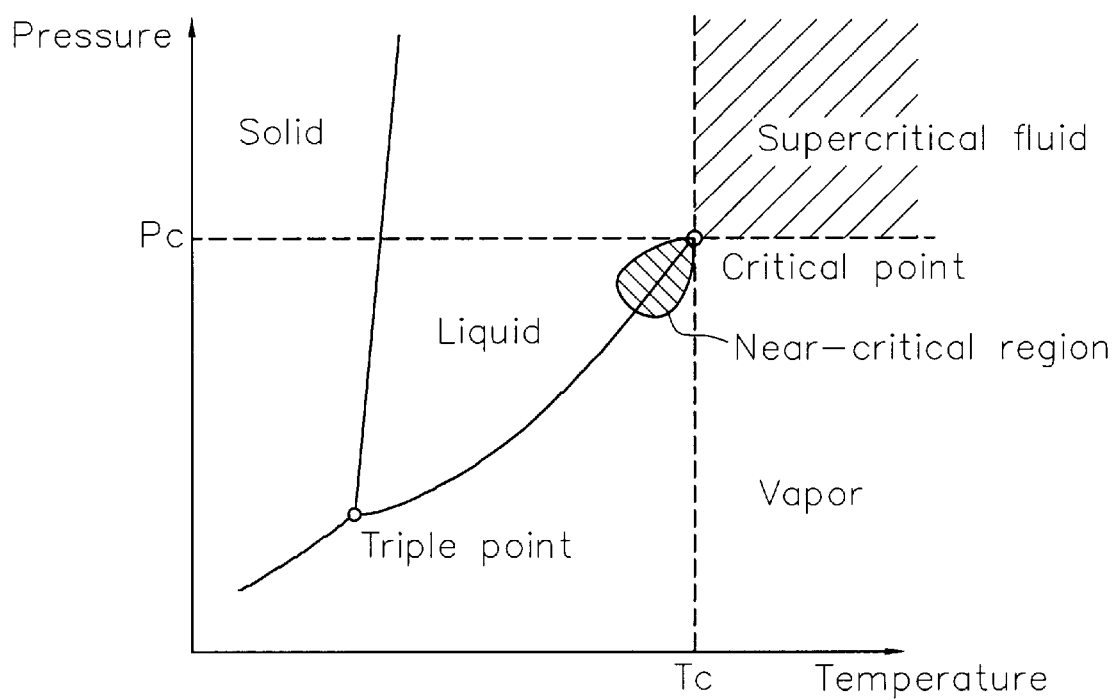
FIG. 7 is a state diagram for a pure component showing supercritical fluid and near critical fluid regions.

Further, as shown in the details of FIG. 6-c, impellers (105) are disposed at a portion directly under said cleaning basket (102) and also a portion in the bottom of a vessel (101), a sound generator (106) directed towards said impellers (105) is disposed along with the wall in said vessel (101), and then powerful agitation is performed with the mutual operation for a forced agitation caused by these equipments and cavitation arisen with said impellers (105) rotating by ultrasonic energy. The above-mentioned cavitation produced by sudden decompression is effective for destroying and killing bacteria as well as bacillus. A pressure recovery vessel (108) is provided for accepting cleaning liquid (107') through a tube (122) placed at lower portion from said pressure cleaning vessel (101). Such an acceptance of cleaning liquid is smoothly performed due to the differences of level and vapor pressure (—temperature control regulator (109) for establishing a temperature gradient is described later—) Said vessel (108) with an internal temperature control regulator (109) has a detachable drain cylinder (110) disposed at the bottom of said vessel (108).

Said pressure recovery vessel (108) has an important role as a divided room for said pressure cleaning vessel (101). Namely, when performing the above mentioned pre-cleaning for removing contaminants (including the massive impurities) soaked in the cleaning liquid (107'), said liquid does not stay in said pressure cleaning vessel (101) since said liquid is immediately received (FIG. 6-a). Therefore, in the afore-mentioned main-cleaning which is performed with the filled compressed liquid (107) in said pressure cleaning vessel (101) after severance of the above-mentioned connection, a complete cleaning effect can be realized because the major contaminants have been already removed in the pre-cleaning (FIG. 6-b). Thus, a problem as to re-adhesion which was very important is entirely solved. In this invention, all of impurities can be removed rapidly by collecting them in a drain cylinder (110), which can be taken off from the system and emptied repeatedly so that it is possible to realize the infinite emission with this system.

Furthermore, in the above narrative of the actual cleaning, the entire solvent boils and there is a cavitation action. An atmospheric container (112) for vapor expansion having a temperature controlling regulator (111) as a means is connected to the upper portion of the pressure cleaning vessel (101) through a vapor path tube (113) and a liquid supply tube (114). and cavitation with expansion is performed for the entire liquid by connection with said vapor path tube (113) while cleaning for a main-cleaning with compressed liquid (107), which is different from a case of using ultrasonic projection. This cavitation is continously repeated by acceration for cooling the liquid with said temperature controlling regulator (111) and connection with a liquid phase supply tube (114). Finally, such a turbulent flow as an ideal which has excellent salvation can be realized.

For the case that there are Impurities difficult to dissolve by only a high density compressed liquefied gas, such impurities can be dissolved by solvent with the surfactants having characteristics for lipophilic, hydrophilic and/or both or them that were added in advance (—so-called micelle phenomenon—), which creates an effective barrier against particle re-adhesion.

Figure 4:
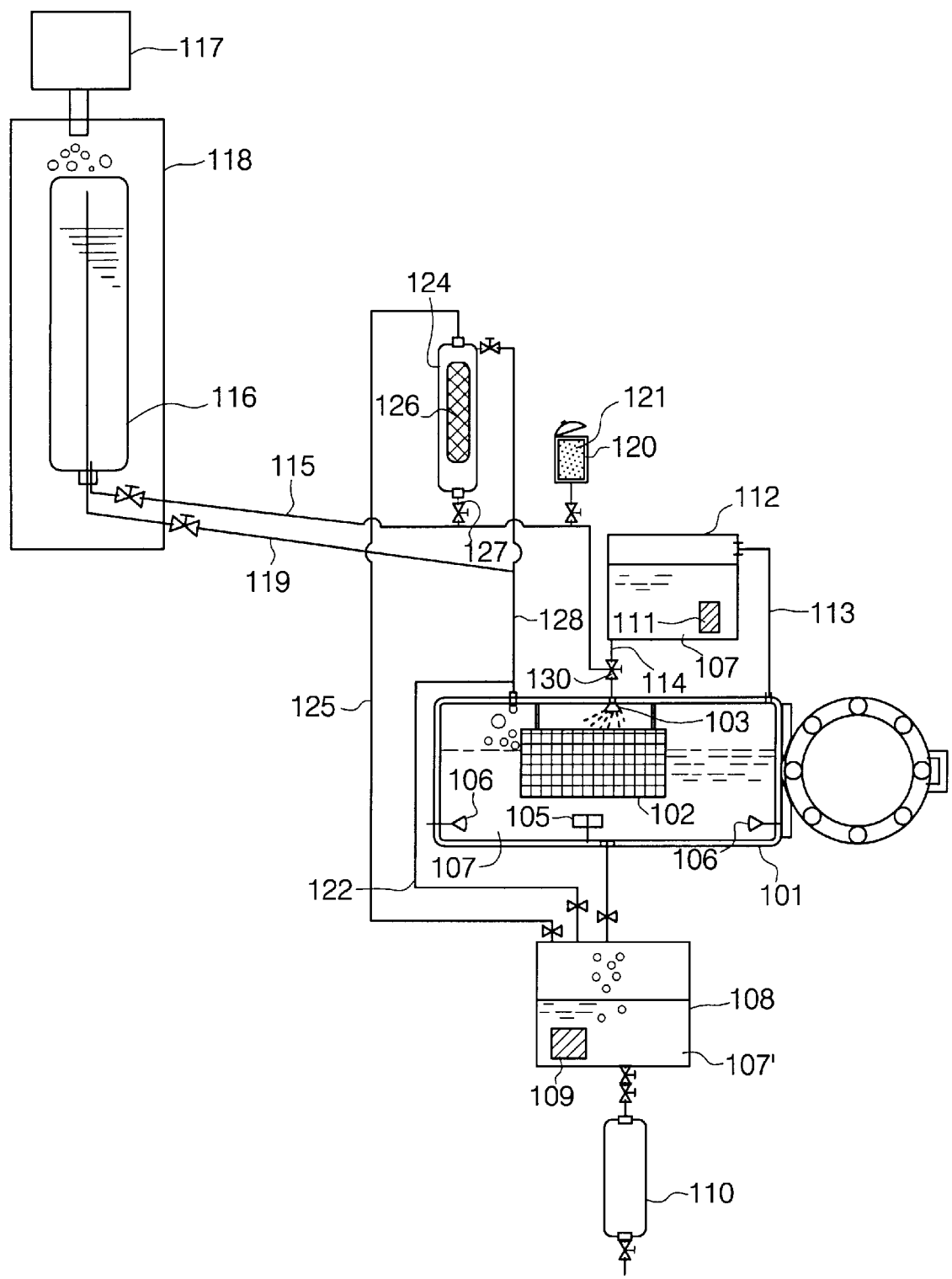
FIGS. 4 and 5 respectively show schematics for equipments as additional functions of this invention, FIGS. 6-*a* and 6-*b* respectively show schematics for a pre-cleaning and a main-cleaning in a cleaning mechanism of this invention, and FIG. 6-*c* shows a schematic for an agitating equipment.
Figure 5:
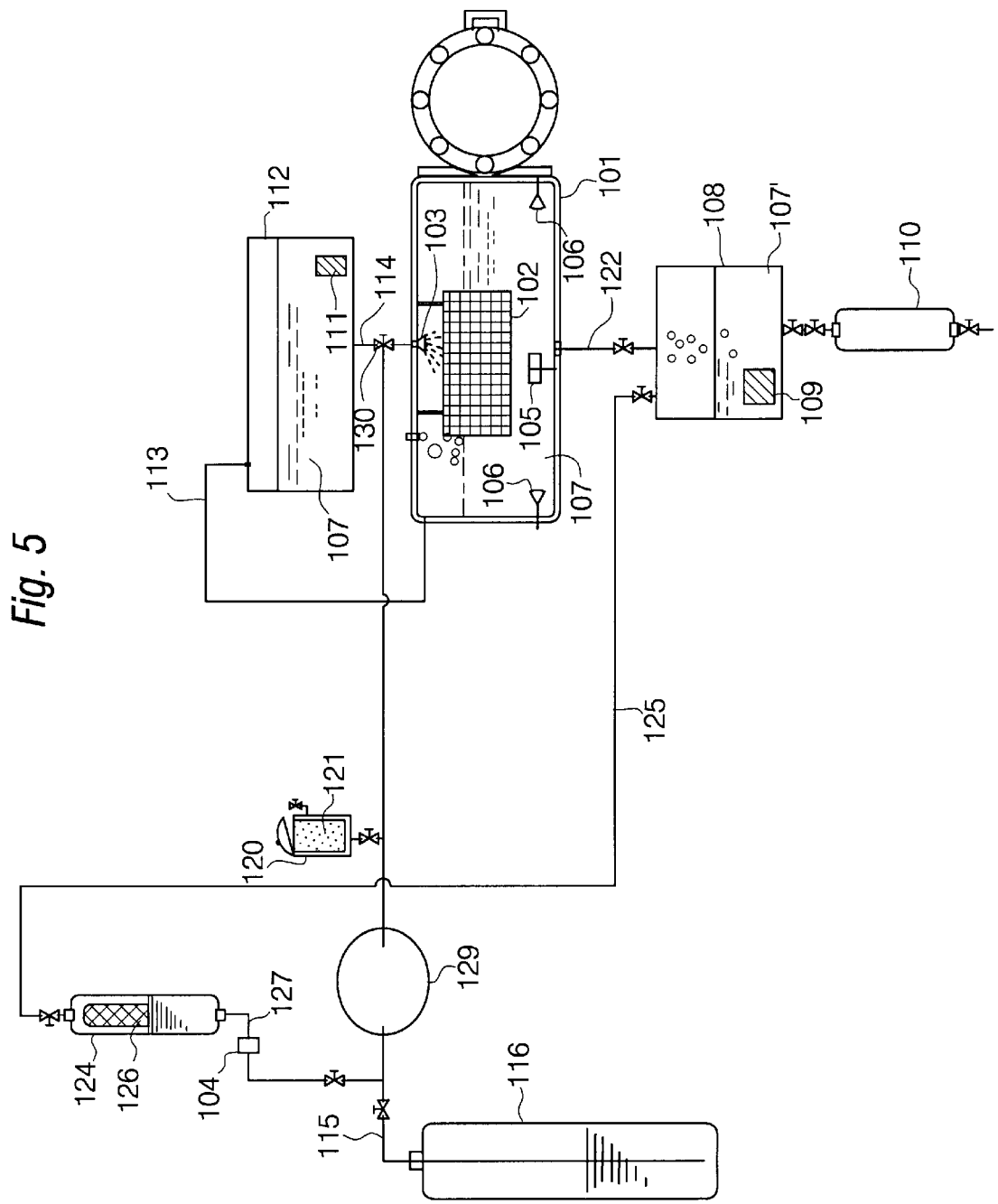

FIGS. 4 and 5 show various arrangements, and FIG. 4 shows methods for solution transport that without exception form a closed recycle system with the high pressure equipment including the above mentioned cleaning mechanisms.

A solvent raw material cylinder (116) filled with a high density compressed liquefied gas supplies compressed liquid (107) to a pressure cleaning vessel (101) from a nozzle (103) through a high pressure tube (115), and a temperature control regulator (117) is accomodated into a box (118) placed higher than said pressure cleaning vessel (101) in order to send said compressed liquid (107) by level difference fall [namely, temperature control regulator (117) establishes a higher temperature for the cylinder (116) and the vapor pressure difference causes reliable fluid transfer to the above pressure cleaning vessel (101) along with the connection of the vapor spaces through the tube (119) for the vapor]. Said high pressure tube (115) joins said liquid phase supply tube (114) at the three way valve (130) and a cylinder (116) or otherwise an atmospheric container (112: a low pressure space) is connected to allow liquid to be fed. An entrainer vessel (120) is connected to said high pressure tube (115) just before the nozzles (103). For said entrainer vessel (120), for the case of difficult to clean contaminants that can not be removed with single component of high density compressed liquefied gases, a lipophilic or hydrophilic substance or possible a surfactant (112) that has affinity for the contaminant is absorbed in the compressed liquid (107) by addition through an orifice in the connection to the tube (115). There is a tube (123) for vapor connection between the pressure cleaning vessel (101) and the pressure recovery vessel (108), which is identical to the above-mentioned vapor path. The vapor phase in the pressure recovery vessel (108) is connected through a tube (125) with the upper portion of a high density compressed liquefied gas supply cylinder (124) placed in higher space from the pressure cleaning vessel (101) as a storage means in a recycle system, the vaporized solvent with the temperature controlling regulator (109) in the pressure recovery vessel (108) is transfer to said high density compressed liquefied gas supply cylinder (124) by means of the vapor pressure difference. On the other hand, contaminated gravity substances and/or entrainers are deposited and concentrated in the lower liquid phase since the vapor phase density of such substances is low and also its solvating power is weak. These concentrated substances are fed to the below drain cylinder (110) to be removed and are separated from the system.

Therefore, a separation and recovery mechanism consisting of said pressure recovery vessel (108) and said high density compressed liquefied supply cylinder (124) can realize contaminant removal and transport of recovered solvent without the need for specialized pressurizing equipment.

A cylinder (124) having an internal temperature controlling regulator (126) cools and liquefies the above-mentioned vaporized solvent. A tube (127) connected with the lower part of a cylinder (124) is connected with a tube (115) in order to further connect to nozzles (103) in the pressure cleaning vessel (101). For completing such a transportation of fluid occurred by level difference, a vapor phase path tube (128) is arranged and connected. Furthermore, under these circumstances, setting said temperature control regulator (126) to heat allows the transfer to be complete. Wherein, a practical system for solvent recycle and recirculation is supplied by using only a temperature control method.

Then, not only excellent cleaning along with a closed recycle system is provided but also, through solvent transport of raw materials through level differences, vapor pressure differences with appropriate vapor phase connections, specialized equipment is unnecessary which allows for a considerable reduction in capital costs and expenses.

FIG. 5 shows solvent transport from a cylinder (116) to said pressure cleaning vessel (101) for the case of using a high pressure generator in the closed recycle system mentioned above, in which the same marks in FIG. 4 are used. In this case, it is not necessary for the cylinder (116) to be arranged at the upper portion from said pressure cleaning vessel (101) since a compressor (129) for deliverying the fluid is provided. A connection between both vapor phases is omitted. Similarly, a coonection between the pressure cleaning vessel (101) and the pressure recovery vessel (108) is omitted. A tube (127) connected to the lower part of a cylinder (124) is connected just before said pressurizing pump (129) placed halfway said high pressure feed tube (115) and further, the internal vapor phase connection between the cylinder (124) and said pressure cleaning vessel (101) are omitted.

In this Figure, a mark 104 shows a filter arranged at the supply side of the cylinder (124). Consequently, a new cleaning mechanism consisting of a pressure cleaning vessel, an atmospheric container (an atmospheric pressure space), a pressure recovery vessel, a high density compressed liquefied gas supply cylinder, etc. and a separation and recovery mechanism actually realize a method for completing solvent recovery with powerful cleaning and an effective renewal of contaminated substances without a high pressure generator, which provides an economical and most effective cleaning system.

Industrial Utilization

In a cleaning method using a high density compressed liquefied gas and having super cleaning power with reference to this invention mentioned above, it is possible to completely perform at levels of particle, sub-micron, super micron, etc. for precisely cleaning contaminants adhered to semiconductor and the like that have not been perfectly cleaned with the current cleaning method.

In contemporary cleaning methods for general industries, for example, for applications in the metal manufacturing field, it takes around twenty (20) to forty (40) minutes for cleaning because of necessary multiple batch processes as various steps, such as preprocess cleaning, primary cleaning, main-cleaning, final cleaning, drying processes and others before and after manufacturing the metal components. However, with the new cleaning method of this invention, the above-mentioned processes for cleaning metals can be completely finished within around two (2) to five (5) minutes since this cleaning method can realize one batch process for such various steps, which consolidates cleaning processes and allows substantial cost-savings. The most remarkable feature in this invention is applicability of cleaning not only metals but also for fibrous materials and furthermore, this method can practically realize a non-polluting cleaning instead of current dry-cleaning.

Explanation of Marks:
  (1) A pressure cleaning vessel
  (2) A cleaning basket
  (3) Nozzles
  (4) A high pressure tube
  (5) Compressed liquid
  (5') Cleaning liquid
  (6) A solvent raw material supply cylinder
  (7) A temperature control regulator
  (8) A box
  (9) A high pressure tube
  (10) Atmospheric containers (Atmospheric pressure space)
  (11) Impellers
  (12) A sound generator

(13) An entrainer vessel
(14) A pressure recovery vessel
(15) A temperature control regulator
(16) A drain cylinder
(17) A vapor path tube
(18) A high density compressed liquefied gas supply cylinder
(19) A tube
(20) A temperature control regulator
(21) A tube
(22) A communicating tube
(23) A three-way valve
(24) A three-way valve
(25) A valve
(26) A valve
(27) An air conditioning control equipment
(28) A room
(101) A pressure cleaning vessel
(102) A cleaning basket
(103) Nozzles
(105) Impellers
(106) A sound generator
(107) Compressed liquid
(107') Cleaning liquid
(108) A pressure recovery vessel
(109) A temperature control regulator
(110) A drain cylinder
(111) A temperature control regulator
(112) Atmospheric containers (Atmospheric pressure space)
(113) A vapor path tube
(114) A liquid supply tube
(115) A high pressure tube
(116) A solvent raw material cylinder
(117) A temperature control regulator
(118) A box
(119) A tube
(120) An entrainer vessel
(122) A tube
(123) A tube
(124) A high density compressed liquefied gas supply cylinder
(125) A tube
(126) A temperature control regulator
(127) A tube
(128) A vapor phase path tube
(129) A high pressure pump

What is claimed:

1. In a closed recycle system wherein objects to be cleaned in a pressure cleaning vessel are contacted by a high density compressed liquefied gas at its near-critical point state as cleaning solvent is injected from outside said pressure cleaning vessel, contaminants adhered to the objects to be cleaned are dissolved in the high density compressed liquefied gas, subsequent to which said liquefied gas containing said contaminants is then transferred to a recovery tank or a separation vessel and decompressed to reduce the density of said liquefied gas so that the contaminants precipitate for separation, and further the cleaning solvent with the contaminants or impurities removed is reclaimed as a high density compressed liquefied gas and stored for reuse;

a method for cleaning and recirculating solvent, wherein a high density compressed liquefied gas existing in near-critical and supercritical state is employed as a solvent, the entire transfer of said solvent is achieved without requiring use of any high pressure generating device by feeding under pressure resulting from a vapor pressure difference between vaporization and liquefaction wherein for said high density compressed liquefied gas the closer to its critical point, the smaller the energy required for vaporization by heating or liquefaction by cooling, and by gravity settling at a set difference in level backed up by the vapor pressure difference, while in the pressure cleaning vessel, the high density compressed liquefied gas is sprayed to the objects to be cleaned for pre-cleaning massive contaminants so that the contaminants can be immediately removed outside the pressure cleaning vessel thereby preventing re-adhesion of the contaminants, and perfect cleaning for a variety of objects to be cleaned is is achieved by forced agitation derived from ultrasonic energy, cavitation affecting the entire solvent by its expansion, and formation of micelles.

2. Cleaning equipment using a high density compressed liquefied gas wherein a closed recycle system comprises:

a pressure cleaning vessel (1) provided with a cleaning basket (2) supported in space within said pressure cleaning vessel for accomodating the objects to be cleaned and a plurality of nozzles (3) to emit a spray of compressed liquid (5) directly to said objects to be cleaned, and atmospheric containers (10) placed over and connected to said pressure cleaning vessel, said cleaning vessel further provided with an agitator consisting of an impeller (11) disposed in the bottom of said cleaning vessel and sound wave generators (12) directed towards said impeller and disposed In the side walls of said cleaning vessel;

a pressure recovery vessel (14) equipped with means for controlling temperature and placed under and branched from said pressure cleaning vessel (1) for receiving the used cleaning liquid after the cleaning process and having a drain cylinder (16) detachably suspended from under said pressure recovery vessel;

a high density compressed liquefied gas supply cylinder (18) equipped with means for controlling temperature and placed over said pressure cleaning vessel (1) so as to provide communication with the upper portion of said pressure recovery vessel (14) and storage for receiving the upper vapor therefrom;

an entrainer vessel (13) disposed and connected halfway the feed line between said high density compressed liquefied gas supply cylinder (18) and said pressure cleaning vessel (1); and said vessels for supplying and receiving the respective compressed liquid are communicating between the respective upper portions thereof for providing communication between the upper vapor in the respective vessels.

3. A cleaning equipment according to claim 2 employing a high density compressed liquefied gas wherein said pressure cleaning vessel is provided with a plurality of exchangeable recycle systems, each of said systems comprises a pressure recovery vessel and a high density compressed liquefied gas supply cylinder.

4. A cleaning equipment according to claim 2 employing a high density compressed liquefied gas wherein a solvent raw material cylinder (6) is placed over said pressure cleaning vessel (1) together with means for controlling temperature, said solvent raw material cylinder and pressure cleaning vessel are communicating between the respective upper portions thereof for providing communication between the upper vapor in the respective vessels.

5. A method for operating cleaning equipment employing high density compressed liquefied gases according to claim 2 wherein, in cases involving impurities which are difficult to be dissolved or cleaned in a single high density compressed liquefied gas, contaminants are cleaned and prevented from re-adhesion by adding hydrophilic, lipophilic surfactant or surfactant having affinity to both hydrophilic and lipophilic solvent to the solvent through an entrainer vessel to create so-called micelle phenomenon which improves cleaning power and functions to prevent re-adhesion of contaminants, and these improvements are combined with forced removal by the impact energy of the Jet stream from the nozzles, cavitation created by bubbling, agitation utilizing ultrasonic wave, thereby purposefully redoubling said improvement.

6. A cleaning mechanism having a function for preventing re-adhesion of contaminants which comprises:

a pressure cleaning vessel (1) provided with a cleaning basket (2) supported in space within said pressure cleaning vessel for accomodating the objects to be cleaned, a plurality of nozzles (3) to emit a spray of compressed liquid (5) directly to said objects to be cleaned, and atmospheric containers (10) placed over and connected to said pressure cleaning vessel, said cleaning vessel further provided with an agitator consisting of an impeller (11) disposed in the bottom of said celeaning vessel and sound wave generators (12) directed towards said impeller and disposed in the side walls of said cleaning vessel;

a pressure recovery vessel (14) equipped with means for controlling temperature and subordinated under and branched from said pressure cleaning vessel (1) for receiving the used cleaning liquid after the cleaning process together with a drain cylinder (16) detachably suspended from under said pressure recovery vessel.

7. In a closed recycling system wherein objects to be cleaned accommodated in a pressure cleaning vessel are contacted by supercritical fluid injected from outside the vessel through means for providing a supercritical state, aqueous and organic contaminants adhered to the objects to be cleaned are dissolved and transferred into said supercritical fluid, which supercritical fluid containing said contaminants is then transferred to a separation tank and decompressed to reduce the density of the supercritical fluid so that these contaminants precipitate for removal, and further the supercritical fluid purified with these contaminants removed is stored with its density recovered for reuse;

a method for cleaning and recirculating solvent, wherein a high density compressed liquefied gas existing in both regions of near-critical and supercritical state is employed as a solvent, the entire transfer of said solvent is achieved without requiring use of any high pressure generating device by feeding under pressure resulting from a vapor pressure difference between vaporization and liquefaction wherein for said high density compressed liquefied gas the closer to its critical point, the smaller the energy required for vaporization by heating or liquefaction by cooling, and by gravity setting at a set difference in level backed up by the vapor pressure difference, while in the pressure cleaning vessel, the high density compressed liquefied gas is sprayed to the objects to be cleaned for pre-cleaning massive contaminants so that the contaminants can be immediately removed outside the pressure cleaning vessel thereby preventing re-adhesion of the contaminants, and perfect cleaning is achieved by forced agitation and cavitation affecting the entire solvent by its expansion, which cavitation is secured and continued through recycling of the solvent.

8. Cleaning mechanism in a supercritical fluid cleaning equipment, said mechanism comprising:

a pressure cleaning vessel (101) provided with a cleaning basket (102) supported in a space within said pressure cleaning vessel for accomodating the objects to be cleaned and a plurality of nozzles (103) to emit a spray of compressed liquid directly to said objects to be cleaned, said cleaning vessel further provided with an agitator consisting of an impeller (105) disposed in the bottom of said cleaning vessel and sound wave generators (106) directed towards said impeller and disposed in the side walls of said cleaning vessel;

a pressure recovery vessel (108) equipped with means for controlling temperature and placed under and branched from said pressure cleaning vessel (101) for receiving the used cleaning liquid after the cleaning process and having a drain cylinder (110) detachably suspended from under said pressure recovery vessel; and a low pressure expansion vessel (112) equipped with means for controlling temperature and placed over said pressure cleaning vessel (101), said expansion vessel providing vapor-phase communication with as well as a recycled supply of liquid phase to the pressure cleaning vessel.

9. A supercritical fluid cleaning equipment wherein a closed recycle system comprises:

a cleaning mechanism according to claim 8;

a high density compressed liquefied gas supply cylinder (124) equipped with means for controlling temperature and placed over said pressure cleaning vessel (101) so as to provide communication with the upper portion of said pressure recovery vessel (108) and storage for receiving the upper vapor therefrom;

an entrainer vessel (120) connected halfway the liquid feed line between said high density compressed liquefied gas supply cylinder (124) and said pressure cleaning vessel (101); and said pressure cleaning vessel (101) and pressure recovery vessel (102), said high density liquefied gas cylinder (124) and pressure cleaning vessel (101) are commnunicating between the respective upper portions thereof for providing communication between the upper vapor in the respective vessels, a solvent raw material cylinder (116) is placed over said pressure cleaning vessel (101) and provided with means for controlling temperature, and establishing communication with the pressure cleaning vessel for communication between the respective upper portions for providing communicaiton between the upper vapor in the respective vessels.

10. A supercritical fluid cleaning equipment wherein a closed recycle system comprises:

a cleaning mechanism according to claim 8;

a high density compressed liquefied gas supply cylinder (124) equipped with means for controlling temperature and placed over said pressure cleaning vessel (101) so as to provide communication with the upper portion of said pressure recovery vessel (108) and storage for receiving the upper vapor therefrom; and an entrainer vessel (120) connected halfway the liquid feed line between said high density compressed liquefied gas supply cylinder (124) and said pressure cleaning vessel (101); and the solvent is pumped through a high pressure pump (129) from said solvent raw material cylinder (116) to the pressure cleaning vessel (101).

11. A method for operating a cleaning mechanism according to claim 8 wherein, in cases involving impurities which are difficult to be dissolved or cleaned in a single high density compressed liquefied gas, contaminants are cleaned and prevented from re-adhesion by adding hydrophilic, lipophilic surfactant or surfactant having affinity to both hydrophilic and lipophilic solvent to the solvent through an entrainer vessel to create so-called micelle phenomenon which improves cleaning power and function of preventing re-adhesion of contaminants.

* * * * *